(12) United States Patent
Hwang et al.

(10) Patent No.: US 8,111,246 B2
(45) Date of Patent: Feb. 7, 2012

(54) TOUCH PANEL INTEGRATED FLAT DISPLAY DEVICE

(75) Inventors: Min Woo Hwang, Gumi-si (KR); Tae Hoon Kim, Yongin-si (KR); Hyeong Dong Kim, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 630 days.

(21) Appl. No.: 12/318,282

(22) Filed: Dec. 23, 2008

(65) Prior Publication Data

US 2009/0284484 A1 Nov. 19, 2009

(30) Foreign Application Priority Data

May 16, 2008 (KR) .................. 10-2008-0045749

(51) Int. Cl.
*G06F 3/041* (2006.01)
(52) U.S. Cl. .................................. 345/173; 178/18.01
(58) Field of Classification Search .................. 345/156, 345/173–175, 177; 178/18.01–18.07
See application file for complete search history.

(56) References Cited

U.S. PATENT DOCUMENTS

| 2004/0080899 | A1* | 4/2004 | Hill et al. ............... 361/680 |
| 2005/0038944 | A1* | 2/2005 | Harada et al. .......... 710/110 |
| 2005/0205778 | A1* | 9/2005 | Kitai et al. ............. 250/309 |
| 2009/0073127 | A1* | 3/2009 | Amiri .................... 345/168 |

FOREIGN PATENT DOCUMENTS

| TW | M269534 | 7/2005 |
| TW | 200744051 | 12/2007 |

* cited by examiner

*Primary Examiner* — Ricardo L Osorio
(74) *Attorney, Agent, or Firm* — McKenna Long & Aldridge LLP

(57) ABSTRACT

A touch panel integrated flat display device capable of improving reliability is disclosed.

The touch panel integrated flat display device includes a display panel, a touch panel disposed on the display panel, and a flexible circuit board electrically connecting a drive PCB and the touch panel to supply a drive signal of the touch panel. In the touch panel integrated flat display device, a plurality of touch panel pads contacting a plurality of flexible circuit board pads are formed at a side of the touch panel, and each of the touch panel pads has at least two contact areas with each of the flexible circuit board pads.

4 Claims, 2 Drawing Sheets

TOUCH PANEL INTEGRATED FLAT DISPLAY DEVICE

This application claims priority under 35 U.S.C. 119 to Korean Patent Application No. 10-2008-0045749, filed on May 16, 2008, which is hereby incorporated by reference for all purposes as if fully set forth herein.

BACKGROUND

1. Field of the Invention

The present invention relates to a tough panel integrated flat display device which can improve reliability.

2. Description of the Related Art

Touch panels are input devices replacing keyboards or mousse used in the industrial fields of computer-aided design (CAD), production systems, game consoles, kiosks, point-of-sale (POS), or medical services. The touch panel is installed on a display surface that is an output device so that a user can manipulate various input operations, for example, directly pressing the display surface at a particular position while viewing an output display surface.

The touch panel is classified into an electrostatic capacity type and a resistant film type according to its operational principle. In the electrostatic capacity type touch panel, while charge/discharge states of an electrostatic capacity are repeated in a single transparent conductive film or a transparent conductive glass, a small amount of charges are accumulated according to a combined capacity of a stylus that is a pen type input device and the transparent conductive film at a contact point of the touch panel pressed by a user. Then, the amount of the charge is read from four input points and calculated into a coordinate value. Thus, electric power must be supplied to the stylus in the electrostatic type touch panel.

In the resistant film type touch panel, while a voltage is applied to two transparent conductive films (resistant films) facing each other, a user presses the touch panel, thus forming a contact point where the two conductive films contact each other. Then, a change in voltage or current at the contact point is read and calculated into X and Y coordinate values. A bus bar (electrode) is needed to read the voltage or current change at the contact point.

The resistant film type touch panel includes a pad connected to an external drive unit to apply a voltage to the resistant film. The pad of the touch panel contacts a flexible circuit board pad located at an end of a flexible circuit board connected to the external drive unit. The pad of the flexible circuit board and the pad of the touch panel are electrically connected to each other by thermally pressing an anisotropic conductive film using a bonding machine. The anisotropic conductive film is an adhesive film including conductive particles.

The touch panel of a general display device has the following disadvantages in the bonding process of the flexible circuit board.

As described above, the anisotropic conductive film is melt at high temperature and then pressed in the bonding process of the flexible circuit board. Since the anisotropic conductive film is not sufficiently filled up between the pad of the touch panel and the pad of the flexible circuit board, contact therebetween may be defective.

That is, in a general touch panel integrated display device, since the pad of the touch panel and the pad of the flexible circuit board are formed to each other, during the bonding process, pressure is locally generated only in an area where the pad of the touch panel and the pad of the flexible circuit board are located so that the anisotropic conductive film is not filled up.

SUMMARY OF THE INVENTION

Accordingly, the present embodiments are directed to a touch panel integrated flat display device that substantially obviates one or more of problems due to the limitations and disadvantages of the related art.

An advantage of the present invention is to provide a touch panel integrated flat display device which can improve reliability.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

To achieve these and other advantages and in accordance with the purpose of the present invention, as embodied and broadly described, a touch panel integrated flat display device includes a display panel, a touch panel arranged on the display panel, and a flexible circuit board electrically connecting a drive PCB and the touch panel to supply a drive signal of the touch panel, wherein a plurality of touch panel pads contacting a plurality of flexible circuit board pads are formed at a side of the touch panel, and each of the touch panel pads has at least two contact areas with each of the flexible circuit board pads.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
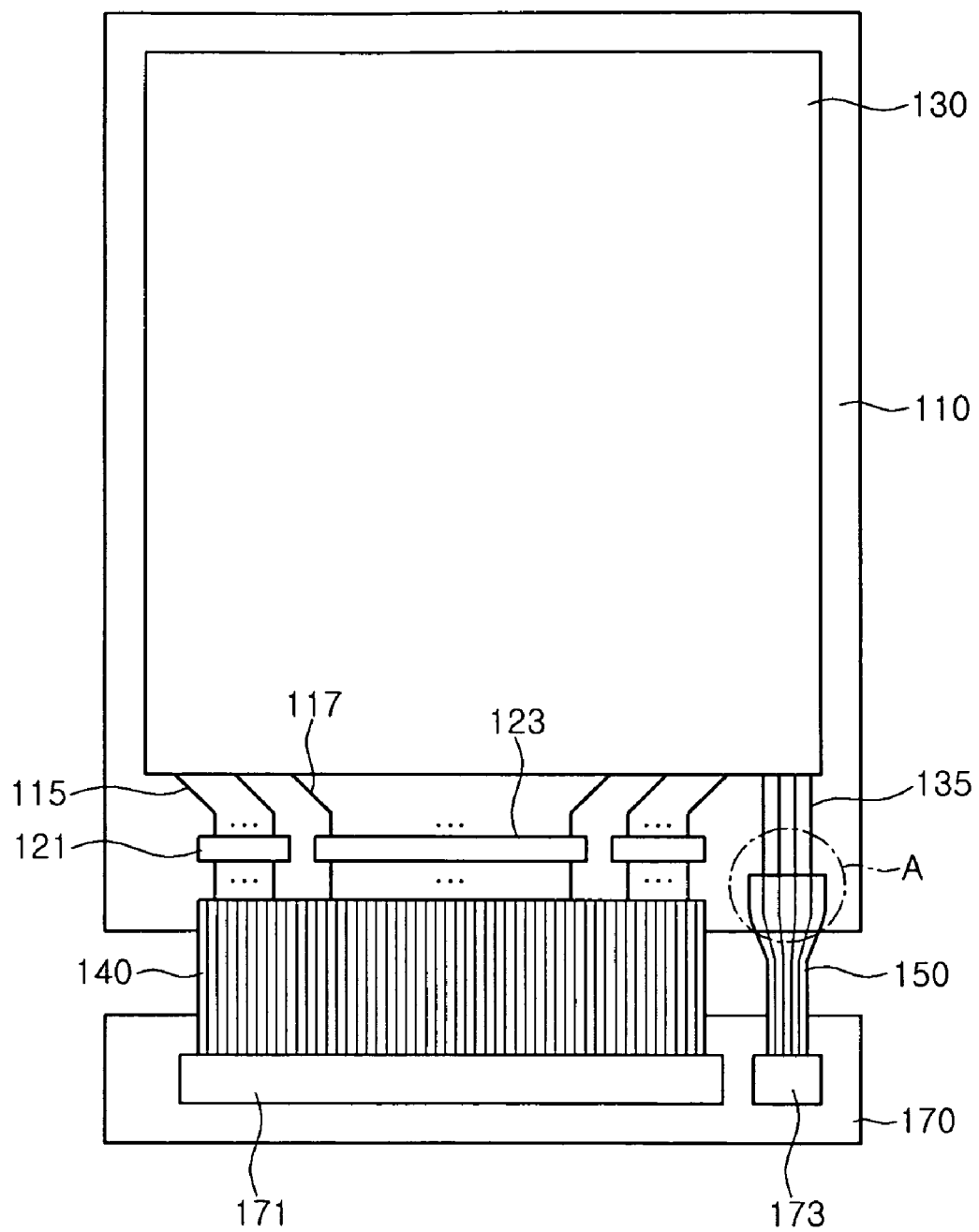
FIG. 1 is a plan view of a touch panel integrated flat display device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 2:
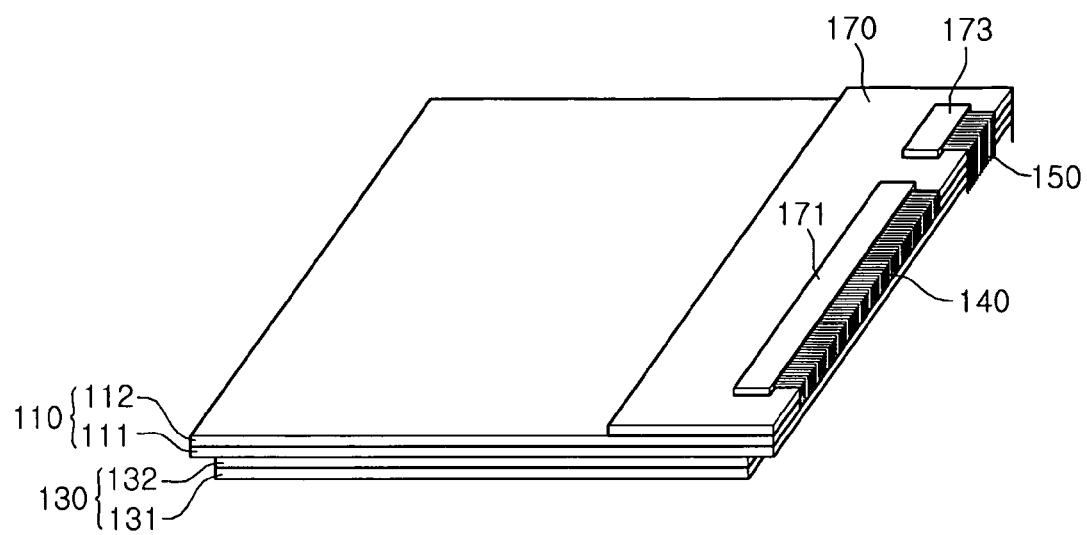
FIG. 2 is a perspective view of the touch panel integrated flat display device of FIG. 1.
Figure 3:
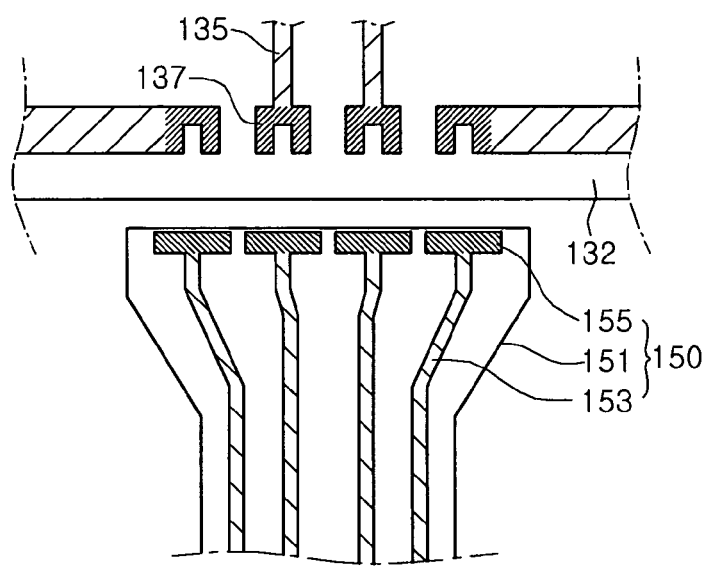
FIG. 3 illustrates a portion A of a pad area in the touch panel integrated display device of FIG. 1.

FIG. 1 is a plan view of a touch panel integrated flat display device according to an embodiment of the present disclosure. FIG. 2 is a perspective view of the touch panel integrated flat display device of FIG. 1. FIG. 3 illustrates a portion A of a pad area in the touch panel integrated flat display device of FIG. 1.

Referring to FIGS. 1 and 2, a touch panel integrated flat display device according to an embodiment of the present disclosure includes a liquid crystal display (LCD) panel 110 displaying an image, a touch panel 130 disposed on the LCD panel 110, and a drive printed circuit board (PCB) 170 on which a drive unit providing a drive signal to drive the LCD panel 110 and the touch panel 130.

The LCD panel 110 includes a color filter substrate 111 and a thin film transistor (TFT) substrate 112, facing each other. Although it is not illustrated in detail in the drawings, a liquid crystal layer (not shown) is formed between the color filter substrate 111 and the TFT substrate 112. Also, the color filter substrate 111 and the TFT substrate 112 are combined together by a sealant (not shown) formed at edges thereof.

A plurality of gate lines 115 and a plurality of data lines 117 are formed on the TFT substrate 112, crossing each other. A TFT (not shown) is formed in each of areas where the gate lines 115 and the data lines 117 cross. A gate terminal (not shown) of the TFT is connected to each of the gate lines 115, a source terminal (not shown) of the TFT is connected to each of the data lines 117, and a drain terminal (not shown) of the TFT is connected to a pixel electrode (not shown) of a liquid crystal cell (not shown).

A gate driver integrated circuit (IC) 121 and a data driver IC 123 are mounted at a side of the TFT substrate 112. The gate driver IC 121 provides a scan signal to each of the gate lines 115. The data driver IC 123 provides a data signal to each of the data lines 117.

The touch panel 130 includes an upper substrate 131, such as, a polyethylene terephthalate film, which is flexible, and a lower substrate 132 arranged to face the upper substrate 131. A transparent conductive film (not shown) is formed on each of the surfaces of the upper and lower substrates 131 and 132, facing each other. A spacer (not shown) spreads out between the upper and lower substrates 131 and 132 so that a particular interval is maintained between the upper and lower substrates 131 and 132.

Although it is not illustrated in detail in the drawings, the drive PCB 170 includes a timing controller (not shown) and a touch panel controller (not shown). The timing controller provides the control signal and the data signal, respectively, to the gate driver IC 121 and the data driver IC 123 of the LCD panel 110. The touch panel controller provides a position detection voltage for detecting the position of the touch panel 130 to the transparent conductive film of the upper substrate 131 and the lower substrate 132 and detects a touch position according to a change in the position detection voltage.

The LCD panel 110 and the touch panel 130 are electrically connected to the drive PCB 170, respectively, by first and second flexible circuit substrates 140 and 150. A side of the first flexible circuit board 140 is connected to an LCD connector 171 mounted on the drive PCB 170. A side of the second flexible circuit board 150 is connected to a touch panel connector 173 mounted on the drive PCB 170. The other side of the first flexible circuit board 140 is connected to an LCD panel pad unit (not shown) formed at a side of the TFT substrate 112 corresponding to the first flexible circuit board 140. The other side of the second flexible circuit board 150 is connected to a touch panel pad unit (not shown) formed at a side of the lower substrate 132 corresponding to the second flexible circuit board 150.

Referring to FIG. 3, the touch panel pad unit and the second flexible circuit board 150 are described in detail. A touch panel pad 137 electrically connected to the second flexible circuit board 150 and a touch panel wiring 135 extending from the touch panel pad 137 and electrically connected to a transparent conductive film (not shown) of the touch panel 130 are formed at a side of the touch panel 130. The touch panel pad 137 has a prong structure, that is, an end tip of each touch panel pad 137 is branched into at least two branches.

A conductive pattern 153 is formed on a flexible film 151 in the second flexible circuit board 150. A flexible circuit board pad 155 is formed at an end of the conductive pattern 153. The flexible circuit board pad 155 has a bar shape and corresponds to the touch panel pad 137.

Both ends of the flexible circuit board pad 155 are in surface contact with at least two branches of the touch panel pad 137. That is, the flexible circuit board pad 155 contacts the touch panel pad 137 in at least two contact areas. Although in the present disclosure the end of the touch panel pad 137 is branched to have two branches to make two contact areas with the flexible circuit board pad 155, the present disclosure is not limited thereto and the contact areas with the flexible circuit board pad 155 may be three or more by modifying the structure of the touch panel pad 137.

The flexible circuit board pad 155 and the touch panel pad 137 having the at least two-branch structure are overlapped by an anisotropic conductive film and electrically connected by using a bonding machine using thermal pressure. In the present disclosure, by dividing (or dispersing) the contact area of the touch panel pad 137 and the flexible circuit board pad 155, a pressure in the contact area of the touch panel pad 137 and the flexible circuit board pad 155 can be uniform.

As described above, in the touch panel integrated flat display device according to an embodiment of the present disclosure, in the bonding process of the touch panel pad and the flexible circuit board pad, since pressure is uniformly maintained by dividing the contact area of the touch panel pad and the flexible circuit board pad into a plurality of areas so that the anisotropic conductive film can be sufficiently filled up between the touch panel pad and the flexible circuit board pad, an attachment force between the touch panel pad 137 and the flexible circuit board pad 155 is improved. Thus, as the present disclosure provides a structure to improve the attachment force between the touch panel pad and the flexible circuit board pad, reliability of the touch panel integrated flat display device can be improved.

Although in the above description the touch panel integrated flat display device configured as above is described as being a resistance film type touch panel, the present disclosure is not limited thereto and may be applied to an electrostatic capacity type touch panel. Also, in the above description the display panel is described as an LCD panel, the present disclosure is not limited thereto and may be applied to other display panel.

It will be apparent to those skilled in the art that various modifications and variations can be made in the present disclosure. Thus, it is intended that the present disclosure cover the modifications and variations of this embodiment provided they come within the scope of the appended claims and their equivalents.

What is claimed is:
1. A touch panel integrated flat display device comprising:
a display panel;
a touch panel arranged on the display panel; and
a flexible circuit board electrically connecting a drive PCB and the touch panel to supply a drive signal of the touch panel, wherein a plurality of touch panel pads contacting a plurality of flexible circuit board pads are formed at a side of the touch panel, and each of the touch panel pads has at least two contact areas with each of the flexible circuit board pads.

2. The touch panel integrated flat display device claimed as claim 1, wherein an end tip of each touch panel pad is branched into at least two branches.

3. The touch panel integrated flat display device claimed as claim 2, wherein the at least two branches of each touch panel pad are in surface contact with both ends of the flexible circuit board pad.

4. The touch panel integrated flat display device claimed as claim 1, wherein the flexible circuit board pad has a bar shape.

\* \* \* \* \*